United States Patent
Kitanaka

(10) Patent No.: US 9,543,862 B2
(45) Date of Patent: Jan. 10, 2017

(54) ELECTRIC MOTOR CONTROL DEVICE AND ELECTRIC MOTOR CONTROL METHOD

(71) Applicant: Hidetoshi Kitanaka, Tokyo (JP)

(72) Inventor: Hidetoshi Kitanaka, Tokyo (JP)

(73) Assignee: MITSUBISHI ELECTRIC CORPORATION, Chiyoda-ku, Tokyo (JP)

(*) Notice: Subject to any disclaimer, the term of this patent is extended or adjusted under 35 U.S.C. 154(b) by 7 days.

(21) Appl. No.: 14/427,862

(22) PCT Filed: Sep. 21, 2012

(86) PCT No.: PCT/JP2012/074236
§ 371 (c)(1),
(2) Date: Mar. 12, 2015

(87) PCT Pub. No.: WO2014/045407
PCT Pub. Date: Mar. 27, 2014

(65) Prior Publication Data
US 2015/0236623 A1 Aug. 20, 2015

(51) Int. Cl.
*H02P 1/54* (2006.01)
*H02P 5/74* (2006.01)
(Continued)

(52) U.S. Cl.
CPC .......... *H02P 5/74* (2013.01); *G01R 31/34* (2013.01); *H02P 3/18* (2013.01); *H02P 27/06* (2013.01)

(58) Field of Classification Search
CPC .......... H02P 5/68; H02P 5/00; H02P 5/685
(Continued)

(56) References Cited

U.S. PATENT DOCUMENTS 4,298,831 A * 11/1981 Espelage .......... H02P 5/74 318/112
4,749,920 A * 6/1988 Jaeger .......... G01R 29/16 318/112
(Continued)

FOREIGN PATENT DOCUMENTS

JP 2003-219699 A 7/2003
JP 2004-080935 A 3/2004
(Continued)

OTHER PUBLICATIONS

International Search Report (PCT/ISA/210) mailed on Dec. 4, 2012, by the Japanese Patent Office as the International Searching Authority for International Application No. PCT/JP2012/074236.
(Continued)

*Primary Examiner* — Rina Duda
(74) *Attorney, Agent, or Firm* — Buchanan Ingersoll & Rooney PC

(57) ABSTRACT

A current command generator 117 generates a current command that indicates a value of current supplied from an inverter circuit to electric motors connected in parallel with the inverter circuit. A voltage command calculator 120 generates a voltage compensation signal for compensating a difference between a value of actual current supplied to each of the electric motors and a value of current indicated by the current command. A determiner 135 determines, based on a value obtained from the voltage compensation signal, whether or not an abnormality is occurring in at least one of the electric motors. A shutdown controller 136 shuts down, upon the determiner 135 determining that an abnormality is occurring, the power supply from the inverter circuit to the each of the electric motors.

10 Claims, 16 Drawing Sheets

(51) Int. Cl.
*G01R 31/34* (2006.01)
*H02P 3/18* (2006.01)
*H02P 27/06* (2006.01)

(58) Field of Classification Search
USPC .................. 318/34, 112, 51, 432, 727, 801
See application file for complete search history.

(56) References Cited

U.S. PATENT DOCUMENTS

| | | | |
|---|---|---|---|
| 6,538,400 B2* | 3/2003 | Fowler | H02K 11/35 180/65.1 |
| 7,288,909 B2* | 10/2007 | Yokozutsumi | B60L 3/10 318/139 |
| 2004/0227520 A1* | 11/2004 | Saunders | G01R 31/34 324/511 |
| 2006/0012322 A1* | 1/2006 | Matsumoto | H02P 5/74 318/432 |
| 2006/0043917 A1 | 3/2006 | Kifuku et al. | |
| 2006/0192506 A1* | 8/2006 | Miffit | B62K 9/02 318/55 |

FOREIGN PATENT DOCUMENTS

| | | |
|---|---|---|
| JP | 2005-176571 A | 6/2005 |
| JP | 2006-067731 A | 3/2006 |
| JP | 2009-118689 A | 5/2009 |

OTHER PUBLICATIONS

Office Action (Notification of Reasons for Rejection) issued on Feb. 24, 2015, by the Japanese Patent Office in corresponding Japanese Patent Application No. 083328 and an English Translation of the Office Action. (5 pages).

* cited by examiner

ELECTRIC MOTOR CONTROL DEVICE AND ELECTRIC MOTOR CONTROL METHOD

TECHNICAL FIELD

The present disclosure relates to an electric motor control device and an electric motor control method.

BACKGROUND ART

There have been proposed various electric motor control devices performing a control to have an electric motor driven by power output from an inverter so as to obtain electric motor power. For example, Patent Literature 1 discloses an electric motor control device that controls induction motors. Torques output from each of the induction motors are transmitted through gears, belts, and the like, and are mechanically combined, and thus greater output is obtained.

CITATION LIST

Patent Literature

Patent Literature 1: Unexamined Japanese Patent Application Kokai Publication No. 2004-80935

SUMMARY OF INVENTION

Technical Problem

When a single electric motor control device controls induction motors, performing the same control as when all induction motors work properly even though an abnormality is occurring in some of the induction motors may cause spreading of damage in the abnormally performing induction motors.

An example of this is when an abnormality occurs in some of the induction motors, whereby torque is not produced even though power is supplied thereto. Possible causes for such an abnormality are, for example, seizing of a bearing in the induction motor due to burn-out and a coil layer short-circuiting occurring inside some of the induction motors. In either case, performing the same control as when all induction motors work properly may cause spreading of damage in the bearing or the coil, and may cause damage to other parts.

It is an objective of the present disclosure to provide, when an abnormality occurs in some of the electric motors, an electric motor control device and an electric motor control method that is capable of preventing the spreading of damage in the abnormally performing electric motor.

Solution to Problem

In order to accomplish the above objectives, an electric motor control device according to the present disclosure includes:

an inverter circuit that supplies power to a plurality of electric motors connected in parallel with the inverter circuit; and a controller that controls the power supplied from the inverter circuit to each of the plurality of electric motors, wherein the controller includes:

a current command generator that generates a current command indicating a value of current supplied from the inverter circuit to the plurality of electric motors;

a compensation calculator that outputs a voltage compensation signal for compensating a difference between a value of actual current supplied to each of the plurality of electric motors and a value of current indicated by the current command;

a determiner that determines, based on a value obtained from the voltage compensation signal, whether or not an abnormality is occurring in at least one of the plurality of electric motors; and a shutdown controller that, upon the determiner determining that an abnormality is occurring, shuts down the power supply from the inverter circuit to each of the plurality of electric motors.

Advantageous Effects of Invention

According to the present disclosure, when it is determined that an abnormality is occurring in at least one of the electric motors based on a value of voltage indicated by a voltage compensation signal, power supply from an inverter circuit to each of the electric motors is shut down. Since the operation of the electric motors can be suspended when an abnormality occurs in some of the electric motors, it becomes possible to prevent the spreading of damage in the abnormally performing electric motors.

DESCRIPTION OF EMBODIMENTS

Figure 1:
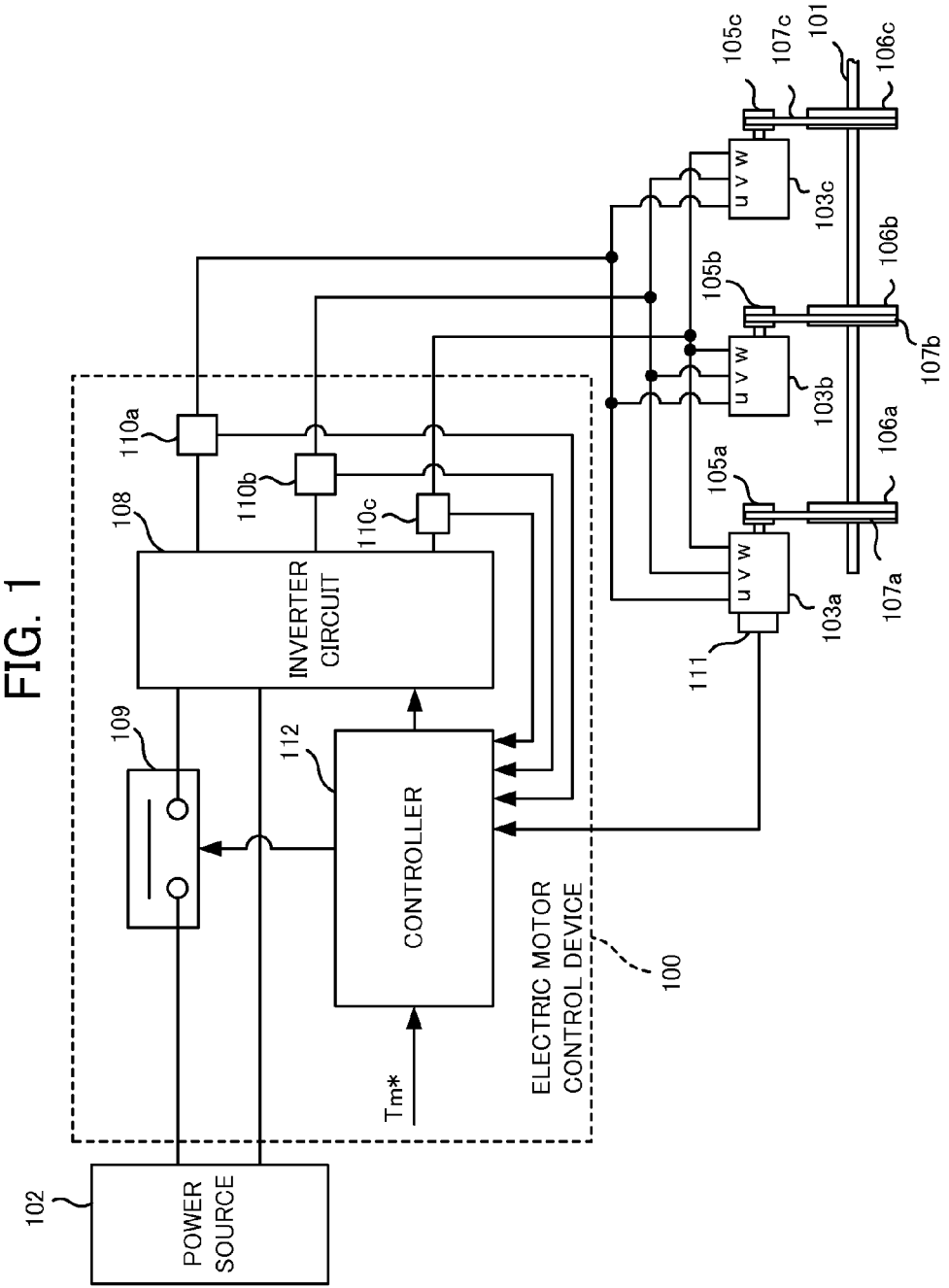
FIG. 1 is a diagram illustrating a configuration of an electric motor control device according to an embodiment of the present disclosure.

Hereinafter, an embodiment of the present disclosure is described with reference to the figures. Throughout all the figures, the same elements are indicated by the same reference numerals.

An electric motor control device 100 according to an embodiment of the present disclosure, as illustrated in FIG. 1 that illustrates a schematic configuration of the electric motor control device 100, converts power supplied by a power source 102, and supplies this converted power to each of the electric motors 103a to 103c, thereby causing each of the electric motors to output torque through an output shaft 101 in accordance with a torque index N that is obtained from, for example, the exterior. In addition, when an abnormality occurs in at least one of the electric motors 103a to 103c, the electric motor control device 100 detects the abnormality, and shuts down power supply to the electric motors 103a to 103c so as to suspend operation of the electric motors 103a to 103c.

In this embodiment, the electric motors 103a to 103c are each a three-phase alternating current (AC) electric motor, and the three electric motors 103a to 103c are connected in parallel with the electric motor control device 100.

Figure 2:
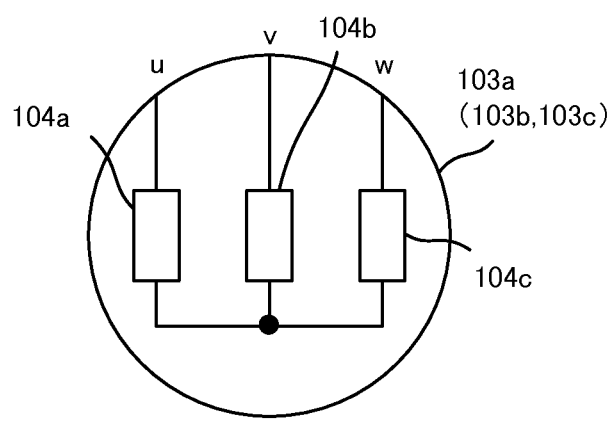
FIG. 2 is a diagram illustrating an example of a circuit configuration of inside an electric motor.

Typically, the electric motors 103a to 103c are the same type, and the respective internal circuit configurations are the same. FIG. 2 illustrates an example of the internal circuit configuration of the electric motor 103a. As illustrated in the figure, the electric motor 103a includes a circuit in which three-phase coils 104a, 104b, and 104c are connected, and rotates a rotating shaft by the effect of a rotating magnetic field generated in the electric motor 103a by allowing currents to flow through the coils 104a, 104b, and 104c, and a current inside an unillustrated rotator. The same is true of the electric motors 103b and 103c.

Each of the rotating shafts of the electric motors 103a to 103c are mechanically connected to the output shaft 101 through a power transmission component as illustrated in FIG. 1. The power transmission component includes, for example, pulleys 105a to 105c that are attached to each of the rotating shafts of the electric motors 103a to 103c, pulleys 106a to 106c that are attached to the output shaft 101, rubber belts 107a to 107c that link the pulleys 105a to 105c with the pulleys 106a to 106c, and the like, as illustrated in the figure. Power transmission means for transmitting the power of the electric motors 103a to 103c to the output shaft 101 is not limited to the aforementioned power transmission component. The power transmission means may transmit the power through, for example, friction.

When all electric motors 103a to 103c work properly, output corresponding to sum of torques output from the electric motors 103a to 103c is obtained from the output shaft 101 via power transmission component, the electric motors 103a to 103c being under control of electric motor control device 100.

The electric motor control device 100 includes an inverter circuit 108, a switch 109, current detectors 110a, 110b, and 110c, a rotational velocity detector 111, and a controller 112, as illustrated in the figure.

The inverter circuit 108 is an electric circuit that converts, upon receiving direct current (DC) power supplied from the power source 102, the DC power into three-phase AC power, and outputs this converted power to each of the electric motors 103a to 103c through a multi-phase conductor.

The switch 109 is a switch installed in the wiring to supply electric power from the power source 102 to the inverter circuit 108, and turns ON/OFF under the control of the controller 112, thereby switching to either supply or not supply power to the inverter circuit 108. When the switch 109 turns ON, electric power is supplied to the inverter circuit 108. When the switch 109 turns OFF, the electric power supply to the inverter circuit 108 is shut down.

The current detectors 110a, 110b, and 110c are detectors that detect values of actual current supplied to the each of the electric motors 103a to 103c, and output current value signals indicating each of the detected values of current. More specifically, the current detectors 110a, 110b, and 110c continuously measure instantaneous values of current (AC output current values) Iu, Iv, and Iw that are output from the inverter circuit 108 and that flow through the multi-phase conductors (u, v, w). The current detectors 110a, 110b, and 110c respectively output, to the controller 112, current signals indicating the measured AC output current values Iu, Iv, and Iw in each phase. Only any two of the current detectors 110a, 110b, and 110c may be provided. A value of current in the unmeasured phase may be calculated based on values of current of the two measured phases among u, v, and w, and a relational expression (Iu+Iv+Iw=0).

The rotational velocity detector 111 is an instrument that measures a rotational velocity ωr [radian per second], that is, the rotational velocity of the rotary shaft of the electric motor 103a, and outputs, to the controller 112, a rotational velocity signal indicating the measured rotational velocity ωr. During a normal state in which no abnormality occurs in the electric motors 103a to 103c, the rotational velocity ωr measured by the rotational velocity detector 111 can be regarded as the rotational velocities ωr of each of the electric motors 103a to 103c because the rotational velocities ωr of each of the electric motors 103a to 103c are approximately consistent.

Figure 3:
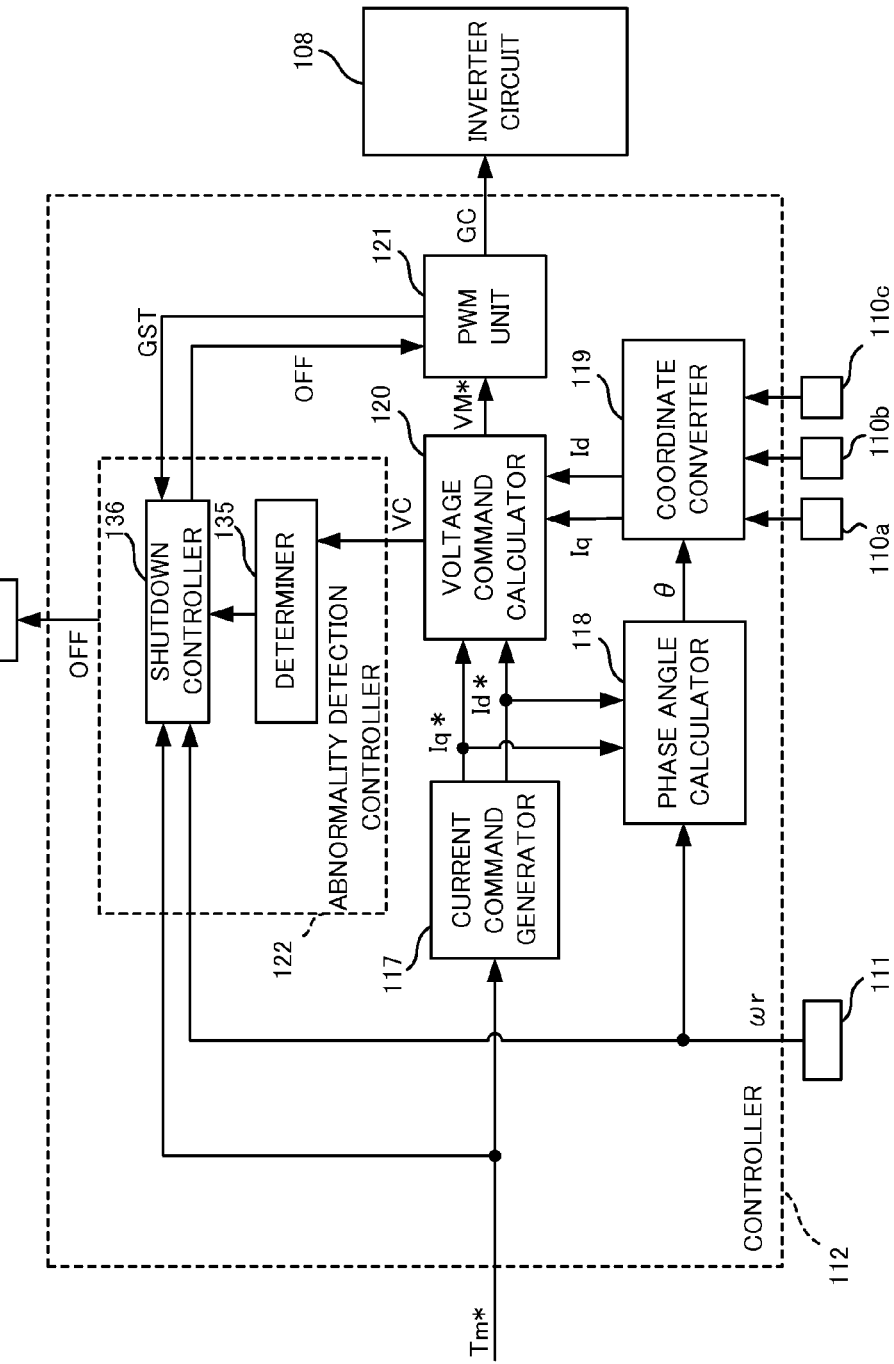
FIG. 3 is a diagram illustrating a configuration of a controller according to the embodiment.

The controller 112 controls the power supply from the inverter circuit 108 to each of the electric motors 103a to 103e by controlling operation of the inverter circuit 108 and that of the switch 109 based on various types of signals. The controller 112 includes a current command generator 117, a phase angle calculator 118, a coordinate converter 119, a voltage command calculator 120, a pulse width modulation (PWM) unit 121, and an abnormality detection controller 122, as illustrated in FIG. 3 that illustrates a functional configuration of the controller 122.

The controller 112 that includes each of these functions may be accomplished by an electric circuit, a processor that executes a pre-installed software program, or by a combination thereof.

The current command generator 117 obtains a torque command from the exterior, and then generates and outputs a current command based on this torque command.

The torque command is a signal that indicates a torque command value Tm*. The torque command value Tm* indicates the torque to be output from each of the electric motors 103a to 103c, or a value or an index that can be associated with this torque. Typically, such torque command value is the value that indicates torque itself that is output from each of the electric motors 103a to 103c.

The current command is a command that indicates a value of current supplied from the inverter circuit 108 to each of the electric motors 103a to 103c, and includes a q-axis (torque component) current command, and a d-axis (magnetic excitation component) current command. The q-axis current command is a signal indicating a q-axis current command value Iq*, that is, a command value of a current associated with the torque output from each of the electric motors 103a to 103c. The d-axis current command is a signal indicating a d-axis current command value Id*, that is, a command value of a current associated with an internal magnetic flux of each electric motor 103a to 103c.

More specifically, the current command generator 117, for example, uses the torque command value Tm*, a secondary magnetic flux command value φ2*, and a circuit constant of the electric motor 103a to calculate the q-axis current command value Iq* by following formula (1) and the d-axis current command value Id* by following formula (2).

In this case, the circuit constant of the electric motor 103a is, for example, a design value indicating circuit characteristics of the circuit with which the electric motor 103a is provided. In the formulae (1) and (2), L2 (=M+l2) represents a secondary self-inductance of the electric motor 103a, M represents a mutual inductance, l2 represents a secondary leakage inductance, s represents a differential operator, PP represents the number of pair polarities of the electric motor 103a, and R2 represents a secondary resistance value of the electric motor 103a.

$$Iq^* = (Tm^*/(\phi 2^* \cdot PP)) \cdot (L2/M) \quad (1)$$

$$Id^* = \phi 2^*/M + L2/(M \cdot R2) \cdot s\phi 2^* \quad (2)$$

The phase angle calculator 118 obtains the rotational velocity signal from the rotational velocity detector 111, and obtains a current command from the current command generator 117. The phase angle calculator 118 calculates, based on the current command, a slip angular velocity command value ωs* to be given to the electric motors 103a to 103c, and calculates a phase angle θ for a coordinate conversion based on the slip angular velocity command value ωs* and the rotational velocity ωr. The phase angle calculator 118 generates and outputs a phase angle signal that indicates the calculated phase angle θ of the coordinate conversion.

More specifically, the phase angle calculator 118 calculates, for example, the slip angular velocity command value ωs* through the following formula (3) using the d-axis current value Id, the q-axis current value Iq, and the circuit constant of the electric motor 103a.

$$\omega s^* = (Iq^*/Id^*) \cdot (R2/L2) \quad (3)$$

In addition, the phase angle calculator 118 calculates the sum of the calculated slip angular velocity command value ωs* and the rotational velocity ωr of the electric motor 103a as an inverter rotational velocity ω, and calculates the phase angle θ of coordinate conversion by integrating this calculated inverter rotational velocity ω.

The coordinate converter 119 calculates, based on the current signals of each of the phases obtained from the current detectors 110a, 110b, and 110c, and on the phase angle signal obtained from the phase angle calculator 118, the q-axis current value Iq corresponding to the torque component and the d-axis current value Id corresponding to the magnetic flux component. The coordinate converter 119 generates and outputs a q-axis current signal indicating the calculated q-axis current value Iq, and a d-axis current signal indicating the calculated d-axis current value Id.

More specifically, the coordinate converter 119 performs, for example, coordinate conversion expressed by the following formula (4).

[Formula 1]

$$\begin{pmatrix} Iq \\ Id \end{pmatrix} = \sqrt{\frac{2}{3}} \begin{pmatrix} \cos\theta & \cos\left(\theta - \frac{2}{3}\pi\right) & \cos\left(\theta + \frac{2}{3}\pi\right) \\ \sin\theta & \sin\left(\theta - \frac{2}{3}\pi\right) & \sin\left(\theta + \frac{2}{3}\pi\right) \end{pmatrix} \cdot \begin{pmatrix} Iu \\ Iv \\ Iw \end{pmatrix} \quad (4)$$

The voltage command calculator 120 generates an inverter-output-voltage command and a voltage compensation quantity signal based on the current command, the q-axis current signal, and the d-axis current signal, and outputs these generated signals.

An inverter-output-voltage command is a signal indicating a value of voltage to be applied to the electric motors 103a to 103c, that is, an inverter-output-voltage command value VM* indicating the three-phase AC voltage value to be output from the inverter circuit 108.

A voltage compensation quantity signal is a signal indicating a voltage compensation quantity VC. The voltage compensation quantity VC is the magnitude of a voltage compensation value. The voltage compensation value is a value of voltage for compensating the value of current that is output from the inverter circuit 108 to each of the electric motors 103a to 103c so that the actual torque output from each of the electric motors 103a to 103c match the torque command value Tm*.

Figure 4:
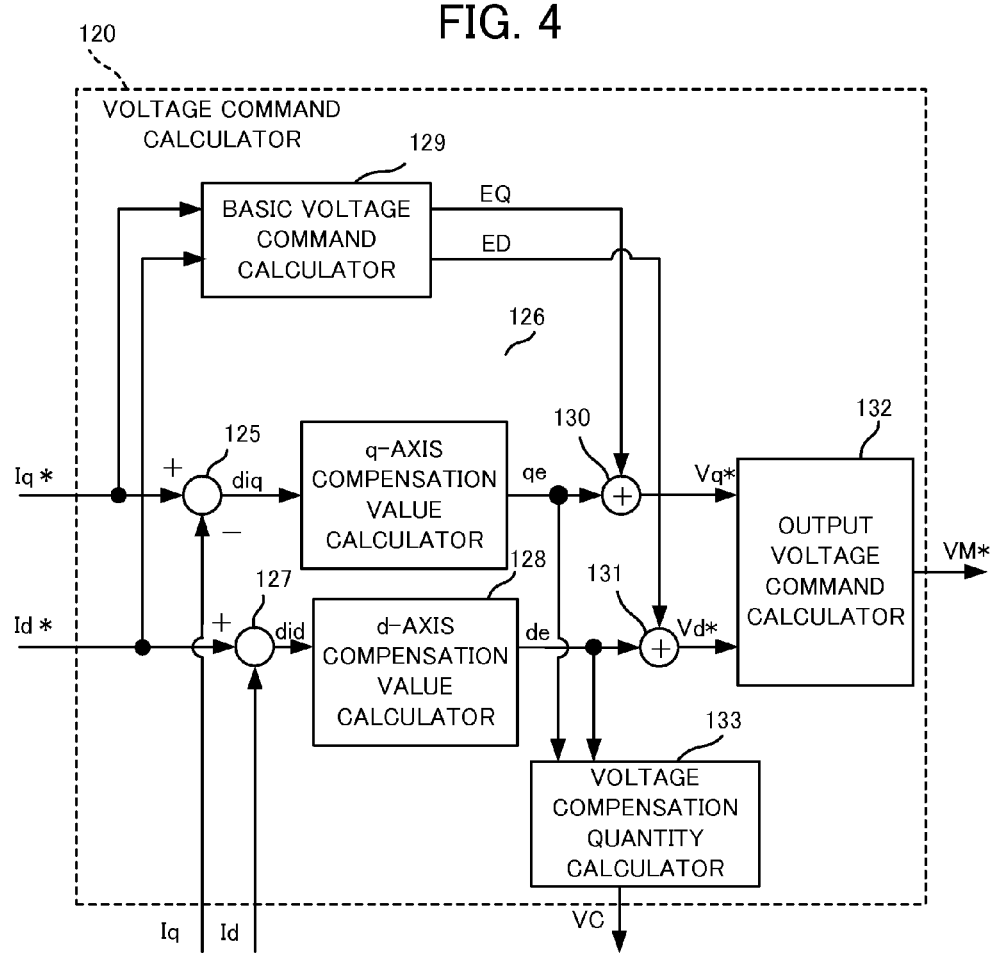
FIG. 4 is a diagram illustrating a configuration of a voltage command calculator according to the embodiment.

As illustrated in FIG. 4, the voltage command calculator 120 includes a q-axis subtractor 125, a q-axis compensation calculator 126, a d-axis subtractor 127, a d-axis compensation calculator 128, a basic voltage command calculator 129, a q-axis adder 130, a d-axis adder 131, an output voltage command calculator 132, and a voltage compensation quantity calculator 133. The q-axis compensation calculator 126, or the d-axis compensation calculator 128, or both the q-axis compensation calculator 126 and the d-axis compensation calculator 128 correspond to a compensation calculator.

The q-axis subtractor 125 obtains the q-axis current command and the q-axis current signal, and calculates the difference between the q-axis current command value Iq* and the q-axis current value Iq (for example, Iq*−Iq). The q-axis subtractor 125 outputs a q-axis difference signal indicating the calculated difference (q-axis difference value) 'diq'.

The q-axis compensation calculator 126 obtains the q-axis difference signal from the q-axis subtractor 125, and calculates a q-axis voltage compensation value 'qe' based on the q-axis difference value 'diq' that is indicated by the q-axis difference signal. The q-axis voltage compensation value 'qe' corresponds to the torque component of the voltage compensation value. The q-axis compensation calculator 126 outputs the q-axis voltage compensation signal indicating the calculated q-axis voltage compensation value 'qe'.

More specifically, the q-axis compensation calculator 126 performs a proportional integral (PI) amplification indicated by the following formula (5). In formula (5), 's' represents a differential operator, K1 represents a proportional gain, and K2 represents an integral gain.

$$qe = (K1 + K2/s) \cdot (Iq^* - Iq) \quad (5)$$

The d-axis subtractor 127 obtains the d-axis current command and the d-axis current signal, and calculates a difference between the d-axis current command value Id* and the d-axis current value Id (for example, Id*−Id). The d-axis subtractor 127 outputs the d-axis difference signal indicating the calculated difference (d-axis difference value) 'did'.

The d-axis compensation calculator 128 obtains the d-axis difference signal from the d-axis subtractor 127, and calculates a d-axis voltage compensation value 'de' based on the d-axis difference value 'did' that is indicated by the d-axis difference signal. The d-axis voltage compensation value 'de' corresponds to the magnetic flux component of the voltage compensation value. The d-axis compensation calculator 128 outputs the d-axis voltage compensation signal indicating the calculated d-axis voltage compensation value 'de'.

More specifically, the d-axis compensation calculator 128 performs, for example, a proportional integral (PI) amplification expressed by the following formula (6). In formula (6), 's' represents a differential operator, K1 represents a proportional gain, and K2 represents an integral gain.

$$de = (K1 + K2/s) \cdot (Id^* - Id) \quad (6)$$

The basic voltage command calculator 129 calculates, based on the current command and the circuit constant of the electric motor 103a, a q-axis basic voltage command value EQ corresponding to the torque component of a basic voltage command value, and a d-axis basic voltage command value ED corresponding to the magnetic flux component of the basic voltage command value, the basic voltage command value being applied to the electric motors 103a to 103c. The basic voltage command calculator 129 generates and outputs a basic voltage command. The basic voltage command includes a q-axis basic voltage command indicating the q-axis basic voltage command value EQ and a d-axis basic voltage command indicating the d-axis basic voltage command value ED.

More specifically, the basic voltage command calculator 129 performs a calculation process through the following formulae (7) and (8). Hence, the basic voltage command calculator 129 calculates both of the q-axis basic voltage command value EQ and the d-axis basic voltage command value ED in a feed-forward manner.

In the formulae (7) and (8), σ represents a leakage coefficient defined as σ=1−M²/(L1·L2). L1 represents a primary self-inductance of the electric motor, which can be calculated as L1=M+l1 using a primary leakage inductance l1. L2 represents a secondary self-inductance that is calculated as L2=M+l2 using a secondary leakage inductance l2.

$$ED = -\omega \cdot L1 \cdot \sigma \cdot Iq^* + (M/L2) \cdot s\phi2^* \quad (7)$$

$$EQ = \omega \cdot L1 \cdot \sigma \cdot Id^* + (\omega \cdot M \cdot \phi2^*)/L2 \quad (8)$$

The q-axis adder 130 obtains the q-axis voltage compensation signal and the q-axis basic voltage command, and then calculates a q-axis voltage command value Vq*. Vq* is the sum of the q-axis voltage compensation value 'qe' and the q-axis basic voltage command value EQ ('qe'+EQ). The q-axis adder 130 generates and outputs a q-axis voltage command that is a signal indicating the q-axis voltage command value Vq*. The q-axis voltage command value Vq* is the q-axis (torque) component of the value of voltage to be applied to the electric motors 103a to 103c.

The d-axis adder 131 obtains the d-axis voltage compensation signal and the d-axis basic voltage command, and then calculates a d-axis voltage command value Vd*. Vd* is the sum of the d-axis voltage compensation value 'de' and the d-axis basic voltage command value DQ (de+DQ). The d-axis adder 131 generates and outputs a d-axis voltage command that is a signal indicating the d-axis voltage command value Vd*. The d-axis voltage command value Vd* is the d-axis (magnetic flux) component of the value of voltage to be applied to the electric motors 103a to 103c.

The output voltage command calculator 132 calculates, based on the q-axis voltage command and the d-axis voltage command, the inverter-output-voltage command value VM*. The output voltage commander calculator 132 generates and outputs the inverter-output-voltage command indicating this inverter-output-voltage command value VM*.

The voltage compensation quantity calculator 133 obtains the q-axis voltage compensation signal and the d-axis voltage compensation signal, and then calculates the voltage compensation quantity VC that indicates the magnitude of the voltage compensation value. The voltage compensation quantity calculator 133 generates and outputs the voltage compensation quantity signal. The voltage compensation quantity signal is a signal that indicates the voltage compensation quantity VC.

More specifically, when, for example, the voltage compensation value is a vector quantity having, as components, the q-axis voltage compensation value 'qe' and the d-axis voltage compensation value 'de', the voltage compensation quantity VC is calculated based on the magnitude of such vector, that is, sqrt (qe^2+de^2). Note that sqrt represents a square root, and ^represents an exponentiation.

As explained above, the voltage command calculator 120 obtains the current command from the current command generator 117. In addition, the voltage command calculator 120 obtains, from the coordinate converter 119, the q-axis current signal and the d-axis current signal that are based on the AC output current values Iu, Iv, and Iw which are measured by the current detectors 110a, 110b and 110c. In this way, the voltage command calculator 120 is capable of adjusting the inverter-output-voltage command value VM* that corresponds to the torque command value Tm* by calculating a difference between the q-axis current value Iq and the q-axis current command value Iq*, and a difference between the d-axis current value Id and the d-axis current command Id* so as to reduce such differences. As a result, it becomes possible to compensate for the control errors originating from an error between the actual circuit constants of the electric motors 103a to 103c and the designed values, and an operation error of the inverter circuit 108 (for example, a voltage drop across an unillustrated switching element and the ON/OFF operation delay of the switching element).

Returning to FIG. 3 again, the PWM unit 121 obtains the inverter-output-voltage command from the voltage command calculator 120, and generates and outputs, based on the inverter-output-voltage command value VM*, a switching signal GC for turning ON/OFF a built-in switching device of the inverter circuit 108.

When an abnormality is occurring in at least one of the electric motors 103a to 103c and a predetermined valid condition is satisfied, the abnormality detection controller 122 shuts down the power supply from the inverter circuit 108 to each of the electric motors 103a to 103c. The abnormality detection controller 122 functionally includes a determiner 135 and a shutdown controller 136, as illustrated in the figure.

The determiner 135 obtains the voltage compensation quantity signal, and determines, based on the voltage compensation quantity VC that is a value obtained from the voltage compensation signal, whether or not an abnormality occurs in at least one of the electric motors 103a to 103c.

More specifically, the determiner 135 makes a comparison between the voltage compensation quantity VC and a predetermined threshold value VCR. When the voltage compensation quantity VC is greater than the threshold value VCR, the determiner 135 determines that an abnormality is occurring in at least one of the electric motors 103a to 103c. When the voltage compensation quantity VC is less than or equal to the threshold value VCR, the determiner 135 determines that an abnormality is not occurring in any of the electric motors 103a to 103c.

Next, a principle for determining the occurrence of an abnormality in the electric motors 103a to 103c based on the voltage compensation quantity VC is explained with reference to FIGS. 5 to 10.

Figure 5:
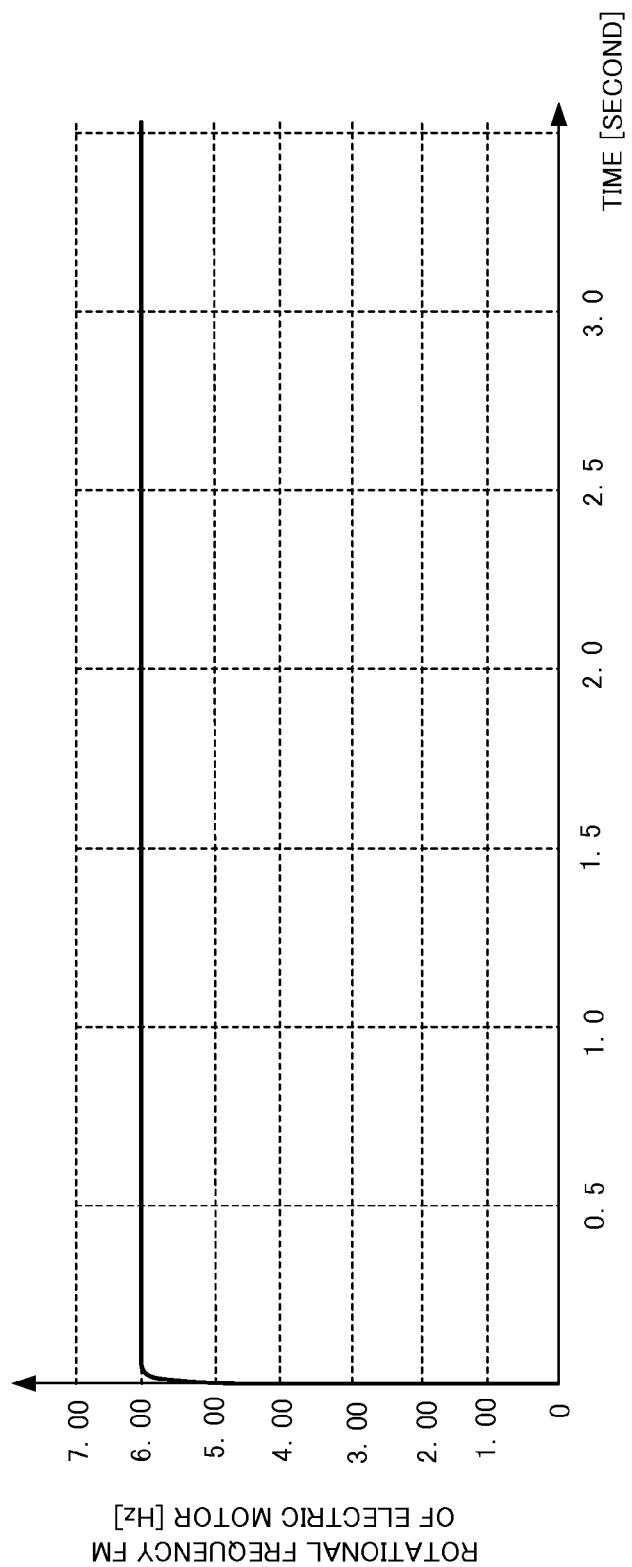
FIG. 5 is a diagram illustrating a time-dependent change in rotational frequency of an electric motor when the electric motor works properly.

FIG. 5 is a diagram illustrating a time-dependent change in a rotational frequency FM (=ωr/2/π) of the electric motor 103a when all electric motors 103a to 103c are working properly. This figure illustrates an example of a condition in which the rotational frequency FM of the electric motors is set to 6 Hz. During a time from 0 seconds to 0.125 seconds, the output shaft 101 is rotated by an externally applied force, and thus the electric motors 103a to 103c are also being rotated. When all electric motors 103a to 103c are working properly, all rotating shafts of the electric motors 103a to 103c ordinarily rotate at substantially the same rotational frequency FM, and thus the rotational frequencies FM of the electric motors 103b and 103c change in the same manner.

Figure 6:
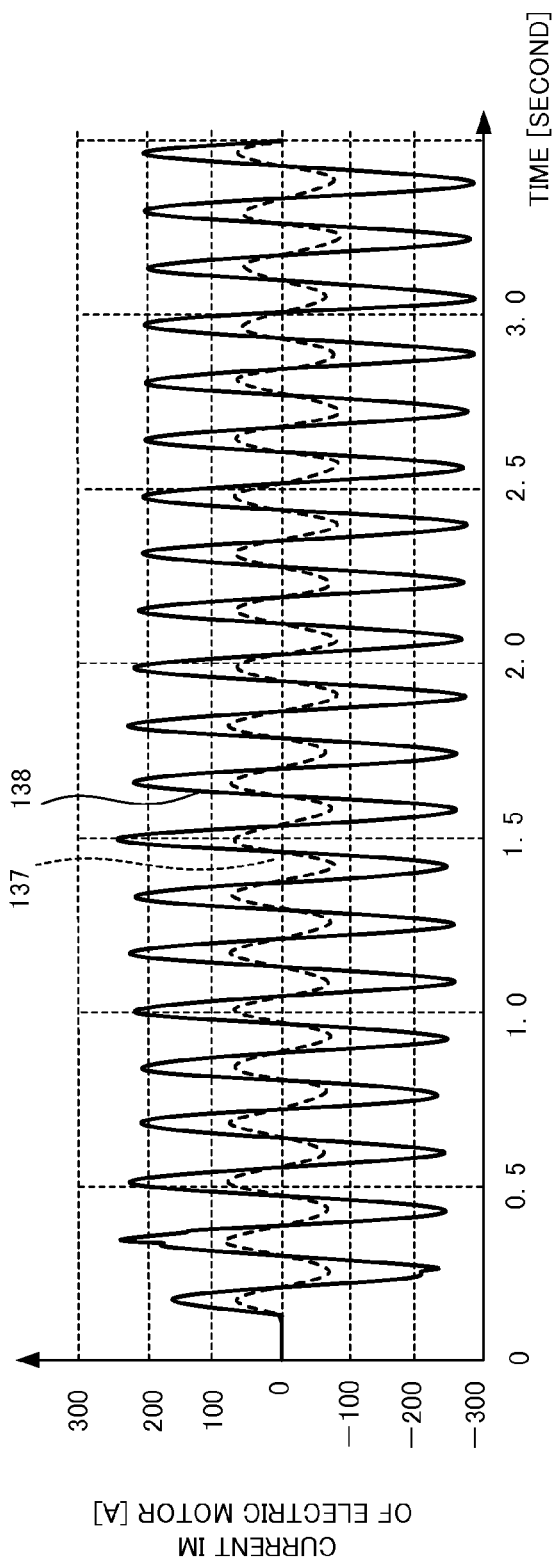
FIG. 6 is a diagram illustrating a time-dependent change in values of current supplied to the electric motor when the electric motor works properly.

FIG. 6 is a diagram illustrating a time-dependent change in values of current IM supplied to the electric motor 103a, and a time-dependent change in the sum of the values of current IM supplied to the electric motors 103a to 103c when all electric motors 103a to 103c are working properly. This figure illustrates an example case in which the inverter circuit 108 is activated at a time of around 0.125 seconds. A dashed line 137 in the figure indicates the time-dependent change in the value of current IM of the electric motor 103a. Since the electric motors 103a to 103c are working properly, the currents IM flowing through the electric motors 103b and 103c change in the same manner. A solid line 138 in the figure indicates the time-dependent change in the sum of the values of current IM of the electric motors 103a to 103c.

Figure 7:
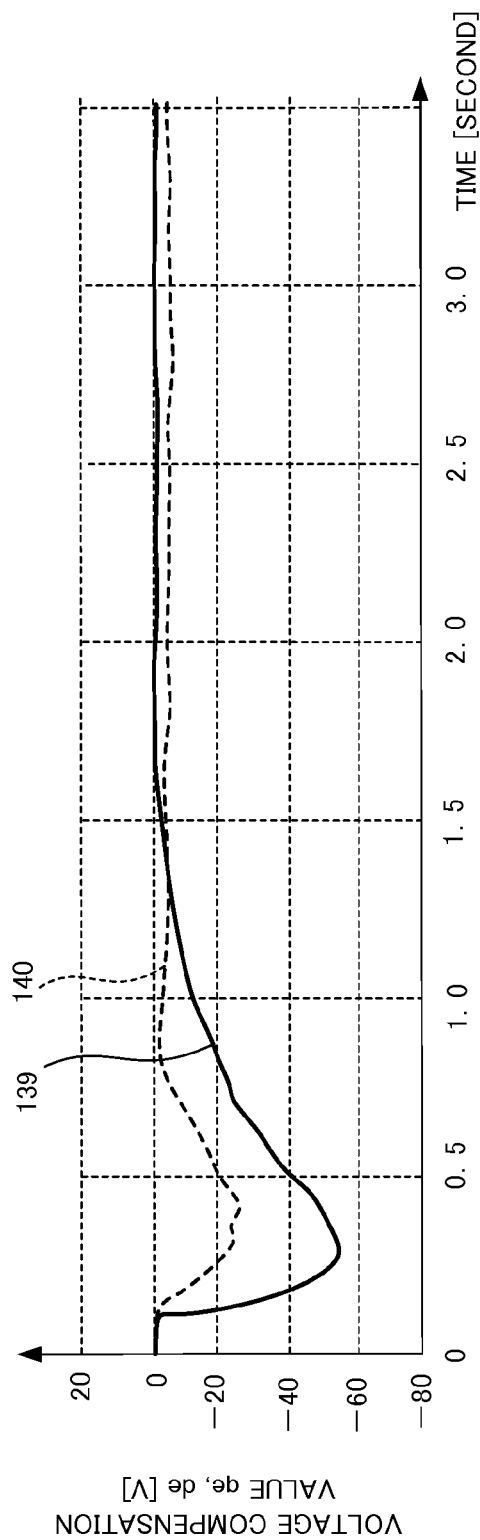
FIG. 7 is a diagram illustrating a time-dependent change in voltage compensation values when the electric motor works properly.

FIG. 7 is a diagram illustrating the voltage compensation values when all electric motors 103a to 103c are working properly, that is, a time-dependent change in the q-axis voltage compensation value 'qe' and a time-dependent change in the d-axis voltage compensation value 'de'. A solid line 139 in the figure indicates the time-dependent change in the q-axis voltage compensation value 'qe'. A dashed line 140 in the figure indicates the time-dependent change in the d-axis voltage compensation value 'de'.

Figure 8:
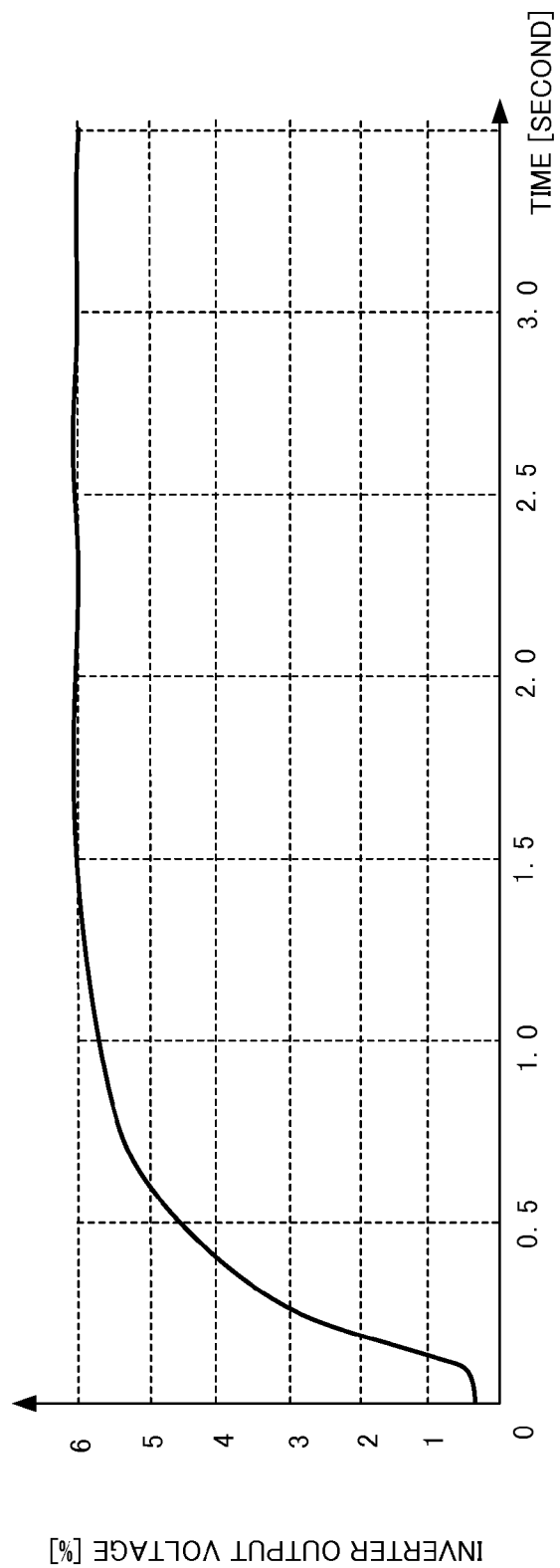
FIG. 8 is a diagram illustrating a time-dependent change in voltage output from an inverter circuit when the electric motor works properly.

FIG. 8 illustrates a time-dependent change in voltage output from the inverter circuit 108 when all electric motors 103a to 103c are working properly. In the figure, the maximum voltage that can be output from the inverter circuit 108 is indicated as 100%.

As illustrated in FIG. 5, when the electric motors 103a to 103c are rotated at the rotational frequency FM of 6 Hz, a voltage corresponding to VM*, that is, a voltage including the q-axis basic voltage command value EQ and the d-axis basic voltage command value ED calculated by the basic voltage command calculator 129 is applied to the electric motors 103a to 103c. Accordingly, the current as illustrated in FIG. 6 flows through the electric motors 103a to 103c. When all electric motors 103a to 103c are working properly, the current components flowing through the electric motors 103a to 103c, that is, the q-axis current value Iq and the d-axis current value Id become substantially consistent with the q-axis current command value Iq* and the d-axis current command value Id*, respectively. Accordingly, as illustrated in FIG. 7, although both q-axis voltage compensation value 'qe' and d-axis voltage compensation value 'de' increase for a certain period of time from the beginning of the control, after a degree of time passes, these values become stable at a small value close to zero.

Figure 9:
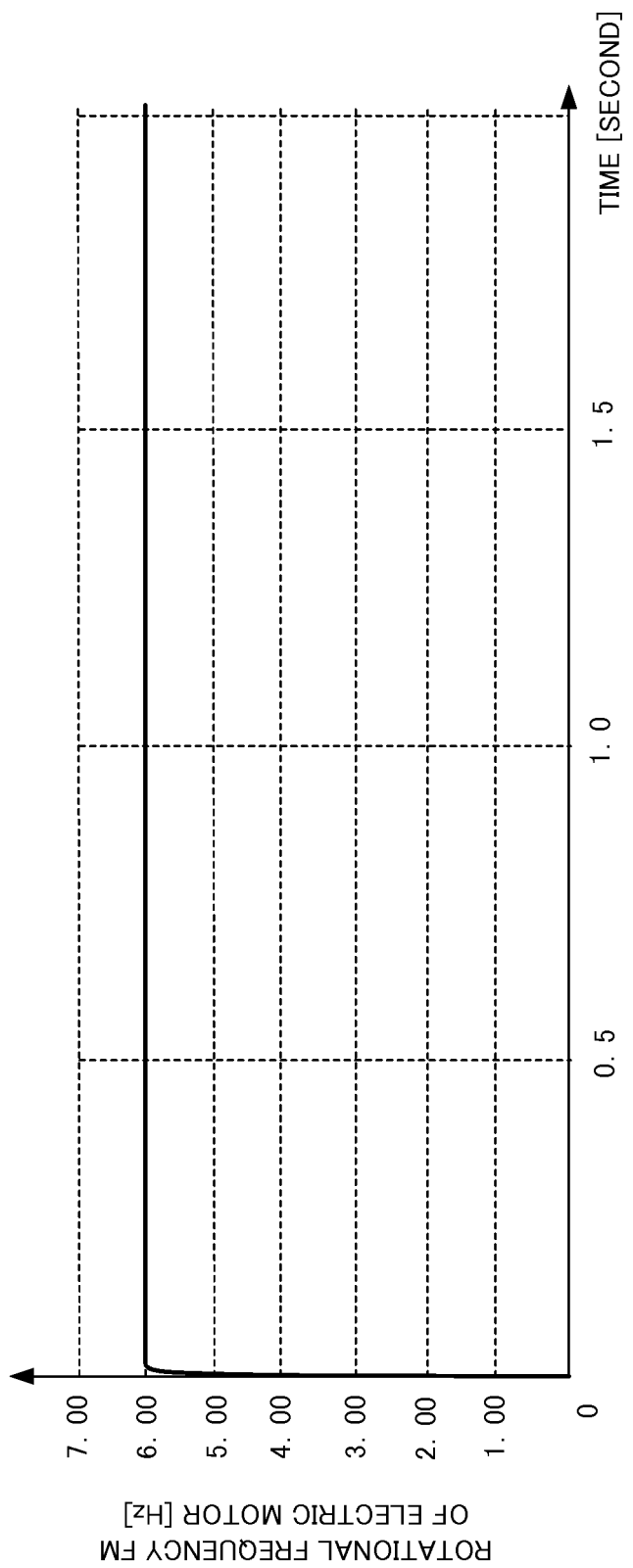
FIG. 9 is a diagram illustrating a time-dependent change in rotational frequencies of the electric motor that works properly when an abnormality occurs in one of the electric motors.

FIG. 9 is a diagram illustrating a time-dependent change in the rotational frequency FM of the properly working electric motor 103a when an abnormality occurs in the electric motor 103c among the electric motors 103a to 103c. This figure illustrates an example condition that the rotational frequency FM of the electric motors is set to be 6 Hz. Up to the time of 0.125 seconds, the output shaft 101 is being rotated by an external force. Hence, the electric motors 103a to 103c are also being rotated. The rotational frequency FM of the properly working electric motor 103b also changes in the same manner.

Figure 10:
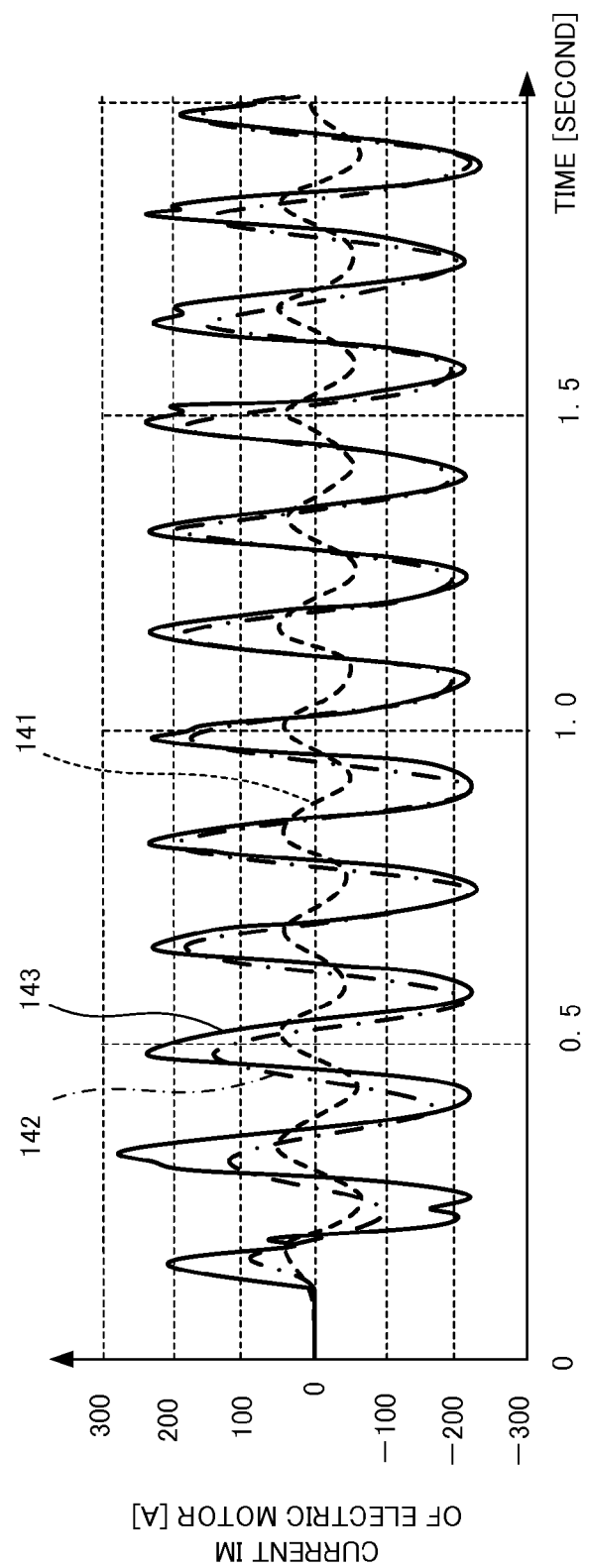
FIG. 10 is a diagram illustrating a time-dependent change in values of current supplied to the electric motor when an abnormality occurs in one of the electric motors.

FIG. 10 is a diagram illustrating a time-dependent change in the current value IM supplied to the properly working electric motor 103a and to the abnormally performing electric motor 103c, and a time-dependent change in the sum of the values of current IM supplied to the electric motors 103a to 103c when the abnormality occurs in the electric motor 103c among the electric motors 103a to 103c. A dashed line 141 in the figure indicates the time-dependent change in the value of current IM of the properly working electric motor 103a. Since the electric motor 103b is working properly, the current IM flowing through the electric motor 103b changes in the same manner as that of the electric motor 103a. A dot-chain line 142 in the figure indicates the time-dependent change in the value of current IM of the abnormally performing electric motor 103c. A solid line 143 in the figure indicates the time-dependent change in the value of current IM of the electric motors 103a to 103c.

Figure 11:
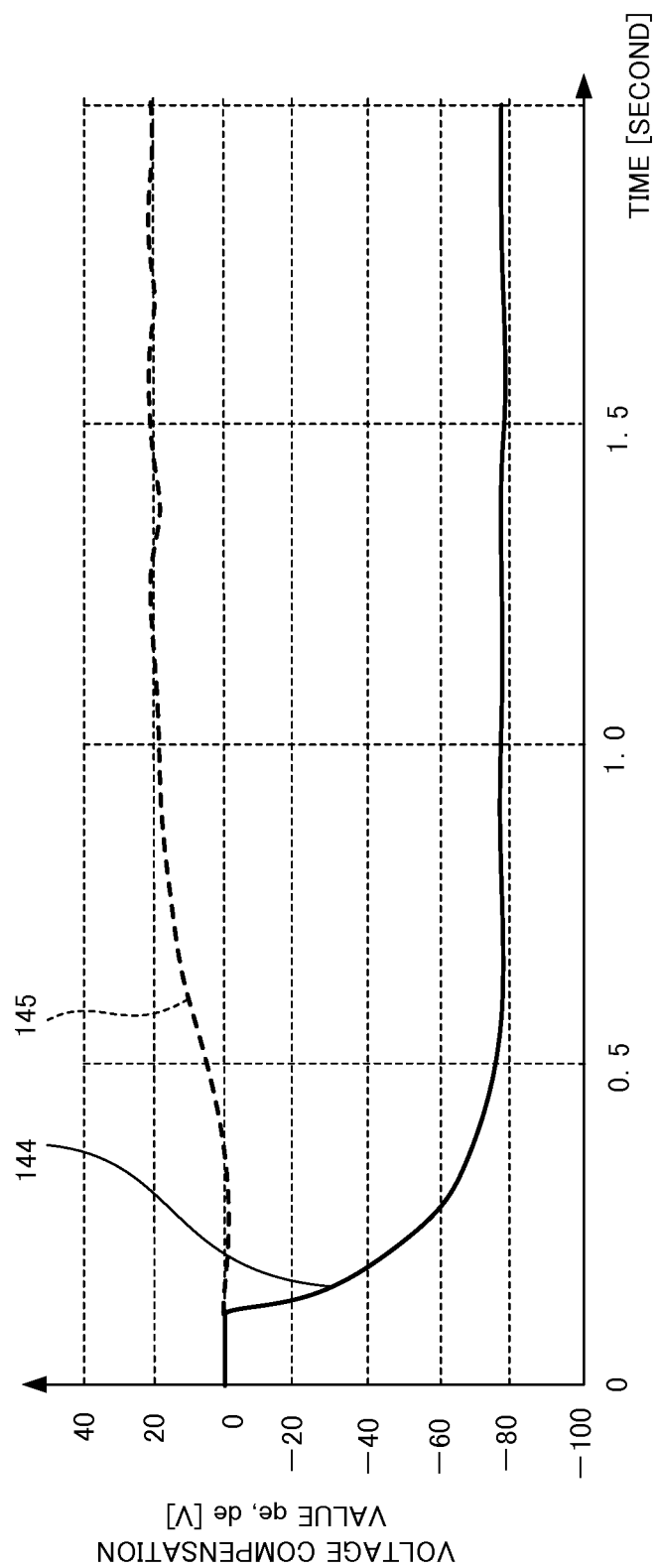
FIG. 11 is a diagram illustrating a time-dependent change in voltage compensation values when an abnormality occurs in one of the electric motors.

FIG. 11 is a diagram illustrating a time-dependent change in the voltage compensation values, that are, the q-axis voltage compensation value 'qe' and the d-axis voltage compensation value 'de' when an abnormality is occurring in the electric motor 103c among the electric motors 103a to 103c. A solid line 144 in this figure indicates the time-dependent change in the q-axis voltage compensation value 'qe'. A dashed line 145 in the figure indicates the time-dependent change in the d-axis voltage compensation value 'de'.

Figure 12:
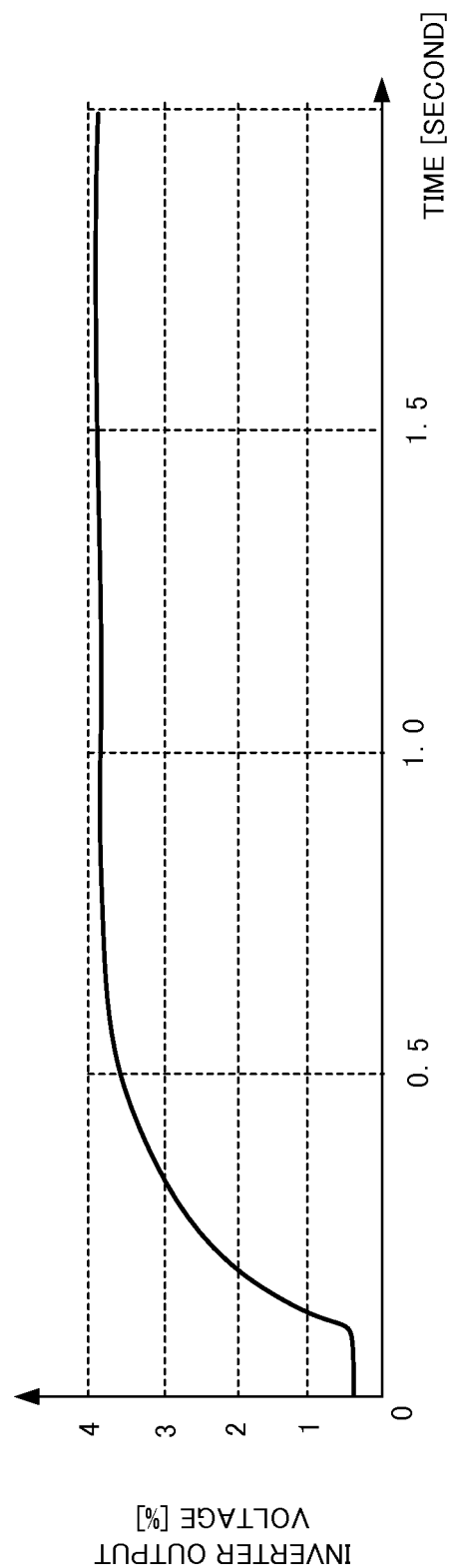
FIG. 12 is a diagram illustrating a time-dependent change in voltage output from an inverter circuit when an abnormality occurs in one of the electric motors.

FIG. 12 illustrates a time-dependent change in the voltage output from the inverter circuit 108 when an abnormality occurs in the electric motor 103c among the electric motors 103a to 103c. In the figure, the maximum voltage that can be output from the inverter circuit 108 is indicated as 100%.

As illustrated in FIG. 9, when it is attempted to rotate the electric motors 103a to 103c at the rotational frequency FM of 6 Hz, a voltage including the q-axis basic voltage command value EQ and the d-axis basic voltage command value ED is applied to the electric motors 103a to 103c although an abnormality is occurring in the electric motor 103c as if all of the electric motors 103a to 103c are working properly.

When an abnormality is occurring in the electric motor 103c, such as freezing of the bearing of rotating shaft, the rotating shaft of the electric motor 103c is non-rotatable although a voltage is applied by the inverter circuit 108. In this case, the output shaft 101 is driven by the electric motors 103a and 103b, but since the rotating shaft of the electric motor 103c is non-rotatable, a slip between each of the pulleys 105c and 106c and the rubber belt 107c occurs and braking is applied to the output shaft of 101c.

Since the rotating shaft of the electric motor 103c is non-rotatable as explained above, no induction voltage to counteract against the voltage applied by the inverter circuit 108 is generated in the electric motor 103c. Accordingly, as illustrated in FIG. 10, a current larger than under normal conditions flows into the electric motor 103c. That is, when a voltage including the q-axis basic voltage command EQ and the d-axis basic voltage command ED calculated through the formulae (7) and (8) is applied to the electric motors 103a to 103c, excessive q-axis current value Iq and excessive d-axis current value Id flow through. Consequently, 'qid' that is a difference between the q-axis current command value Iq* and the q-axis current value Iq, and 'did', that is a difference between the d-axis current command value Id* and the d-axis current value Id, become large.

The voltage command calculator 120 calculates the q-axis voltage compensation value 'qe' and the d-axis voltage compensation value 'de' so as to reduce the q-axis difference value 'qid' and the d-axis difference value 'did'. Accordingly, the voltage applied to the electric motor 103c is decreased, and thus, as illustrated in FIG. 11, the absolute value of the q-axis voltage compensation value 'qe' and that of the d-axis voltage compensation value 'de' become larger than when the electric motors 103a to 103c work properly.

Hence, when an abnormality occurs in the electric motor 103c, the voltage compensation quantity that represents the magnitude of voltage compensation value increases in comparison with a case in which all electric motors 103a to 103c work properly. Thus, it is possible to determine whether or not an abnormality is occurring in any one of the electric motors 103a to 103c by making a comparison between the voltage compensation quantity indicated by the voltage compensation quantity signal and the threshold value VCR.

The shutdown controller 136 obtains the torque command from the exterior thereof, the rotational velocity signal from the rotational velocity detector 111, and an operation status signal GST from the PWM unit 121.

The operation status signal GST is a signal that indicates an operation status of whether or not the inverter circuit 108 is being operated. In order for the inverter circuit 108 to operate, the shutdown controller 136 obtains a signal that is output from the PWM unit 121 as the operation status signal GST. The shutdown controller 136 may obtain a signal from the inverter circuit 108 that indicates the operation status thereof as the operation status signal GST instead of the signal from the PWM unit 121. In addition, the shutdown controller 136 may obtain a signal relevant to an operation/non-operation status of the inverter circuit 108 from controllers other than the PWM unit 121.

The shutdown controller 136 determines whether or not the predetermined valid condition is satisfied based on the torque command value TM*, the rotational velocity ωr, and the operation status of the inverter circuit 108. When the valid condition is satisfied and the determiner 135 determines that an abnormality is occurring, the shutdown controller 136 outputs a shutdown signal OFF to the switch 109 and to the PWM unit 121.

The valid condition is a condition for improving the accuracy of determination by the determiner 135, and includes the absolute value of the torque command value Tm* being equal to or less than the threshold value TmR, the rotational frequency FM being greater than the threshold value FMR, and a time T from the start of the operation of the inverter circuit 108 being equal to or longer than a certain time T1. The valid condition may include any one or two of the details such as the absolute value of the torque command value Tm* being equal to or less than the threshold value TmR, the rotational frequency FM being greater than the threshold value FMR, and the time T from the start of the operation of the inverter circuit 108 being equal to or longer than the certain time T1.

An explanation for the reasons why the accuracy of determination by the determiner 135 is improved under such a valid condition is given later.

The shutdown controller 136 shuts down the power supply from the inverter circuit 108 to each of the electric motors 103a to 103c by outputting the shutdown signal OFF. More specifically, for example, the switch 109 that has obtained the shutdown signal OFF interrupts the power supply to the inverter circuit 108. The PWM unit 121 that has obtained the shutdown signal OFF suspends its operation, and as a result, the operation of the inverter circuit 108 is suspended. The power supply from the inverter circuit 108 to each of the electric motors 103a to 103c is shut down when the operation of the inverter circuit 108 is suspended. Hence, the shutdown signal OFF may only be output to either the switch 109 or the PWM unit 121.

When an abnormality is occurring in the electric motor 103c, a current larger than under normal conditions flows as explained above. Thus, if the power supply to each of the electric motors 103a to 103c is continued, the bearing of the electric motor 103c may sustain greater damage, and may cause new damage due to overheating. Hence, by shutting down the power supply to each of the electric motors 103a to 103c, it becomes possible to prevent the spreading of damage in the abnormally performing electric motor 103c.

Next, the reasons why the accuracy of determination by the determiner 135 can be improved by implementing the aforementioned valid condition are explained with reference to the figures.

The reasons why the valid condition includes the time T from the start of operation of the inverter circuit 108 is equal to or longer than the certain time T1 is explained.

As is clear from FIGS. 7 and 11, in order to obtain the stabilized q-axis voltage compensation value 'qe' and d-axis voltage compensation value 'de' regardless of whether all of the electric motors 103a to 103c are performing properly or any one of the electric motors 103a to 103c are performing abnormally, a certain amount of time is necessary after the start of the operation of inverter circuit 108. When, for example, all electric motors 103a to 103c work properly, it takes approximately 3 seconds until the values become stabilized. When an abnormality occurs in one of the electric motors 103a to 103c, it takes approximately 1.0 second.

Since it is determined that whether there is an abnormality based on the voltage compensation quantity VC, a false determination is possibly made if the determination is performed when the q-axis voltage compensation value 'qe' or the d-axis voltage compensation value 'de' is excessively large. Thus, by having the condition in which the time T from the start of the operation of the inverter circuit 108 is equal to or longer than the certain time T1 included in the valid condition, the accuracy of determination by the determiner 135 can be improved. As for the certain time T1, a time of approximately 1.0 second to 3 seconds may preferably be set in the aforementioned example.

Next, the reasons why the valid condition includes the rotational frequency FM is greater than the threshold value FMR are explained.

Figure 13:
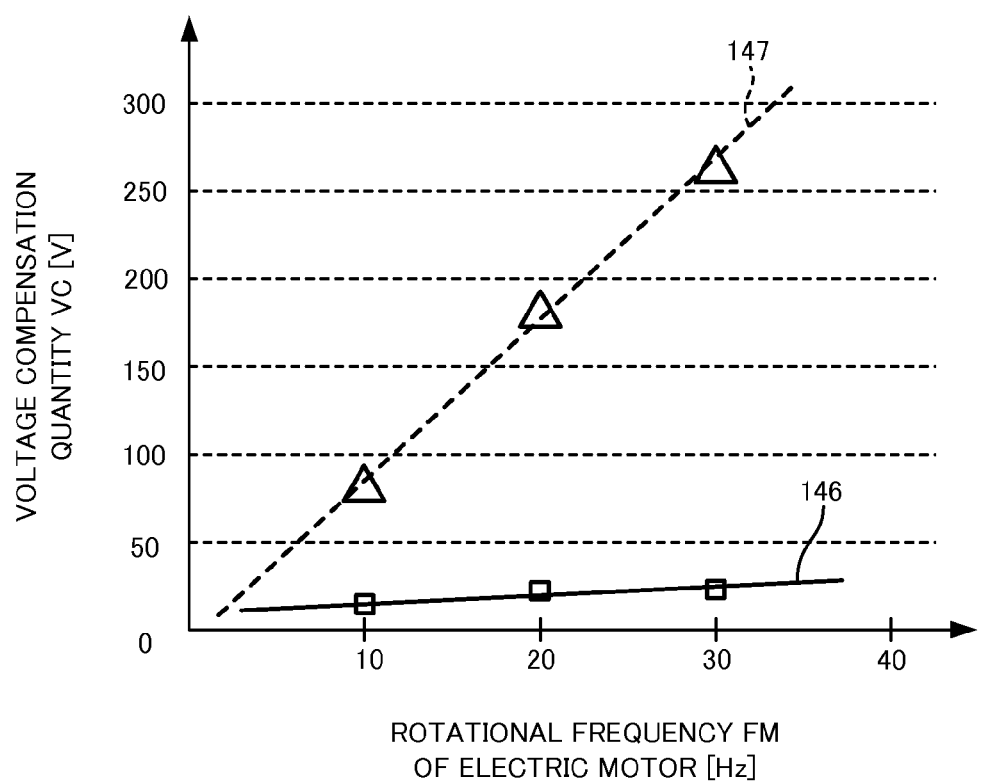
FIG. 13 is a diagram illustrating a relationship between a voltage compensation quantity and a rotational frequency of the electric motor when all electric motors work properly, and when an abnormality occurs in one of the electric motors.

FIG. 13 is a diagram illustrating a relationship between the rotational frequency FM of the electric motors and the voltage compensation quantity VC. When all of the electric motors 103a to 103c work properly, the voltage compensation quantity VC is small regardless of the rotational frequency FM of the electric motors, as indicated by a solid line 146 in this figure. Conversely, when an abnormality occurs in any one of the electric motors 103a to 103c, the voltage compensation quantity VC increases as the rotational frequency FM of the electric motors becomes greater, as indicated in a dashed line 147 in the figure. Accordingly, a difference between the voltage compensation quantity VC when all the electric motors 103a to 103c work properly and the voltage compensation quantity VC when an abnormality occurs in any one of the electric motors 103a to 103c becomes smaller as the rotational frequency FM of the electric motor becomes less. Hence, when the rotational frequency FM of the electric motor is low, it is difficult to determine whether or not there is an abnormality in the electric motors 103a to 103c, which may result in a false determination. Therefore, by having the high rotational frequency FM, that is, by having the condition in which the rotational frequency FM is greater than the threshold value FMR included in the valid condition, the accuracy of determination by the determiner 135 is improved.

Next, the reasons why the valid condition includes the absolute value of the torque command value Tm* is equal to or less than the threshold value TmR are explained.

In general, a secondary resistance value R2 of the electric motors 103a to 103c fluctuates from the designed value in accordance with a change in temperature and the like of the electric motors 103a to 103c. Hence, an error may occur between a set value of the secondary resistance value R2 that is one of the circuit constants of the electric motors 103a to 103c set for the electric motor control device 100, and the actual secondary resistance value R2.

Figure 14:
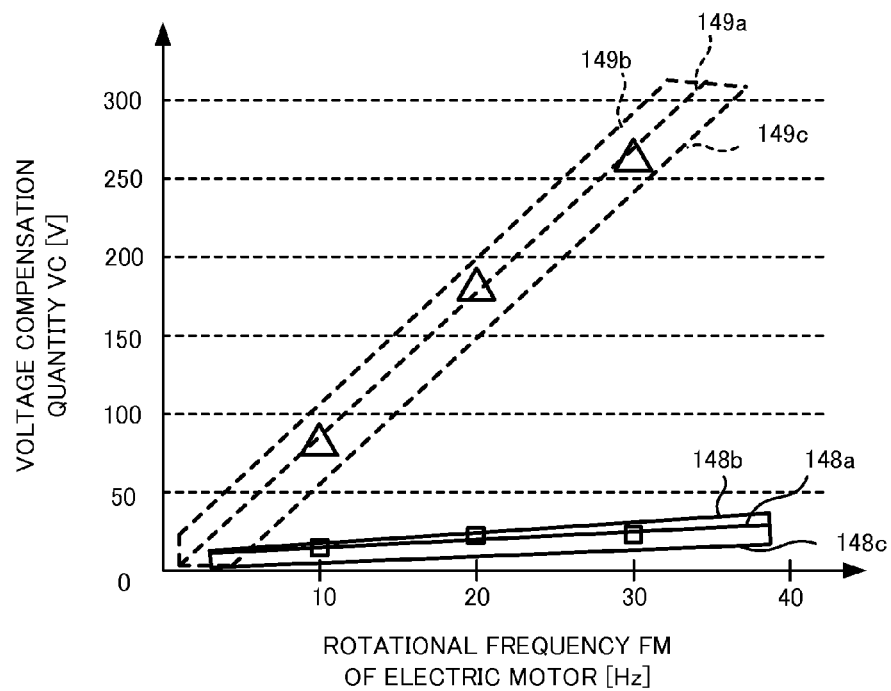
FIG. 14 is a diagram illustrating a relationship between a voltage compensation quantity and a rotational frequency of the electric motor having a torque command value that is 10% of rated output of an electric motor when all electric motors work properly, and when an abnormality occurs in one of the electric motors.

FIG. 14 is a diagram illustrating a relationship between the rotational frequency FM of the electric motors 103a to 103c and the voltage compensation quantity VC when the torque command value Tm* is 10% of the rated output of each of the electric motors 103a to 103c. Assuming that the secondary resistance value R2 of the electric motors 103a to 103c fluctuates in accordance with the surrounding environments as explained above, this figure illustrates an example in which the set value of the secondary resistance value R2 fluctuates within a range between 50% and 200%, the secondary resistance value R2 being one of the circuit constants of the electric motors 103a to 103c set for the electric motor controller device 100.

When all of the electric motors 103a to 103c work properly, the voltage compensation quantity VC fluctuates within a region surrounded by two straight lines 148b and 148c located above and below a straight line 148a, as indicated by solid lines in the figure. When an abnormality occurs in any one of the electric motors 103a to 103c, the voltage compensation quantity VC fluctuates within a region surrounded by two straight lines 149b and 149c located above and below a straight line 149a, as indicated by dashed lines in the figure.

Figure 15:
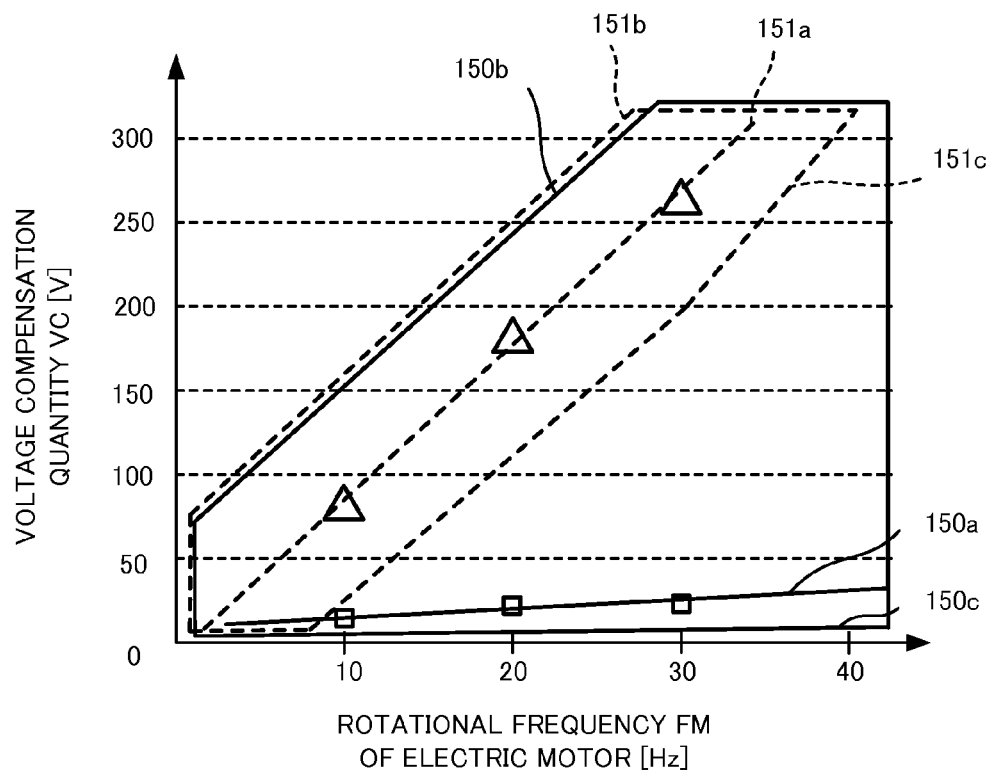
FIG. 15 is a diagram illustrating a relationship between a voltage compensation quantity and a rotational frequency of the electric motor having a torque command value that is 100% of rated output of the electric motor when all electric motors work properly, and when an abnormality occurs in one of the electric motors.

FIG. 15 is a diagram illustrating a relationship between the rotational frequency FM of the electric motors 103a to 103c and the voltage compensation quantity VC when the torque command value Tm* is 100% of the rated output of each of the electric motors 103a to 103c. This figure also illustrates an example in which the set value of the secondary resistance value R2 fluctuates within a range between 50% and 200%, the secondary resistance value R2 being one of the circuit constants of the electric motor 103a to 103c set for the electric motor control device 100.

When all electric motors 103a to 103c work properly, the voltage compensation quantity VC fluctuates within a region surrounded by solid lines including two straight lines 150b and 150c located above and below a straight line 150a, as indicated by a solid line in the figure. When an abnormality occurs in any one of the electric motors 103a to 103c, the voltage compensation quantity VC fluctuates within a region surrounded by dashed lines including two straight lines 151b and 151c located above and below a straight line 151a, as indicated by a dashed line in the figure.

According to a comparison between FIG. 14 and FIG. 15, when the torque command value Tm* is large, although all electric motors 103a to 103c work properly, the voltage compensation quantity VC fluctuates within a region that is substantially as large as when an abnormality occurs in any one of the electric motors 103a to 103c. Thus, when the torque command value Tm* is large, it is difficult to determine whether there is an abnormality in the electric motors 103a to 103c, which may result in a false determination.

Accordingly, the greater the torque command value Tm* is, the greater the adverse effect of the fluctuation in the secondary resistance value R2 of the electric motors 103a to 103c to the voltage compensation quantity VC becomes. The reasons are explained below.

A slip angular velocity command value $\omega s^*$ is calculated through the formula (3) according to a set value of the electric motor control device 100. Thus, when there is an error between the set value of the secondary resistance value R2 and the actual secondary resistance value R2, the slip angular velocity command value $\omega s^*$ to be calculated deviates from a correct value in accordance with the actual secondary resistance value R2.

Even if the basic voltage command value (the q-axis basic voltage command value EQ and the d-axis basic voltage command value ED) is applied to the normal electric motors 103a to 103c with the slip angular velocity command value $\omega s^*$ being deviated from the correct value, the q-axis current value Iq and the d-axis current value Id respectively deviate from the q-axis current command value Iq* and the d-axis current command value Id*. As a result, in order to compensate for the deviations, the absolute values of the q-axis voltage compensation value 'qe' and d-axis voltage compensation value 'de' become large, and thus the voltage compensation quantity VC increases.

Referring again to the formula (3), the slip angular velocity command value $\omega s^*$ is proportional to the product of the q-axis current command value Iq* and the secondary resistance value R2. In addition, the q-axis current command value Iq* is typically in a proportional relationship with the torque command value Tm*. Hence, the greater the torque command value Tm* is, the greater the q-axis current command value Iq* becomes. Thus, the greater the torque command value Tm* is, the more calculated angular velocity command value ωs* deviates from the correct value in accordance with the actual secondary resistance value R2. Hence, the greater the torque command value Tm* is, the greater the adverse effect of the fluctuation in the secondary resistance value R2 of the electric motors 103a to 103c becomes to the voltage compensation quantity VC.

Therefore, by having the condition in which the absolute value of the torque command value Tm* is equal to or less than the threshold value TmR included in the valid condition, the accuracy of determination by the determiner 135 can be improved. In this case, the threshold value TmR may be a value that is, for example, smaller than the rated torque of the electric motors 103a to 103c, and is preferably equal to or less than 50% of the rated toque.

Note that by referring to formula (3) as explained above, the slip angular velocity command value ωs* is proportional to the product of the q-axis current command value Iq* and the secondary resistance value R2. Thus, the greater the q-axis current command value Iq* is, the more the calculated slip angular velocity command value ωs* deviates from the correct value in accordance with the actual secondary resistance value R2. Hence, the greater the q-axis current command value Iq* is, the greater the adverse effect of the fluctuation in the secondary resistance value R2 of the electric motors 103a to 103c becomes to the voltage compensation value VC.

Therefore, by having the q-axis current command value Iq* that is the value of current indicated by the current command included in the valid condition instead of torques, the accuracy of determination by the determiner 135 is improved. Likewise, by having the condition in which the current value Iq supplied to any one of the electric motors 103a to 103c is equal to or less than the threshold value included in the valid condition, the accuracy of determination by the determiner 135 is also improved.

The valid conditions with the q-axis current command value Iq* and the torque command value Tm* were explained as examples, but the valid condition with another signal equivalent to the command values (for example, a signal containing a command that is relevant to the magnitudes of outputs from the electric motors 103a to 103c and that is given by an upper-level control device, a value or an index that can be associated with the magnitudes of the outputs by the electric motors 103a to 103c).

Figure 16:
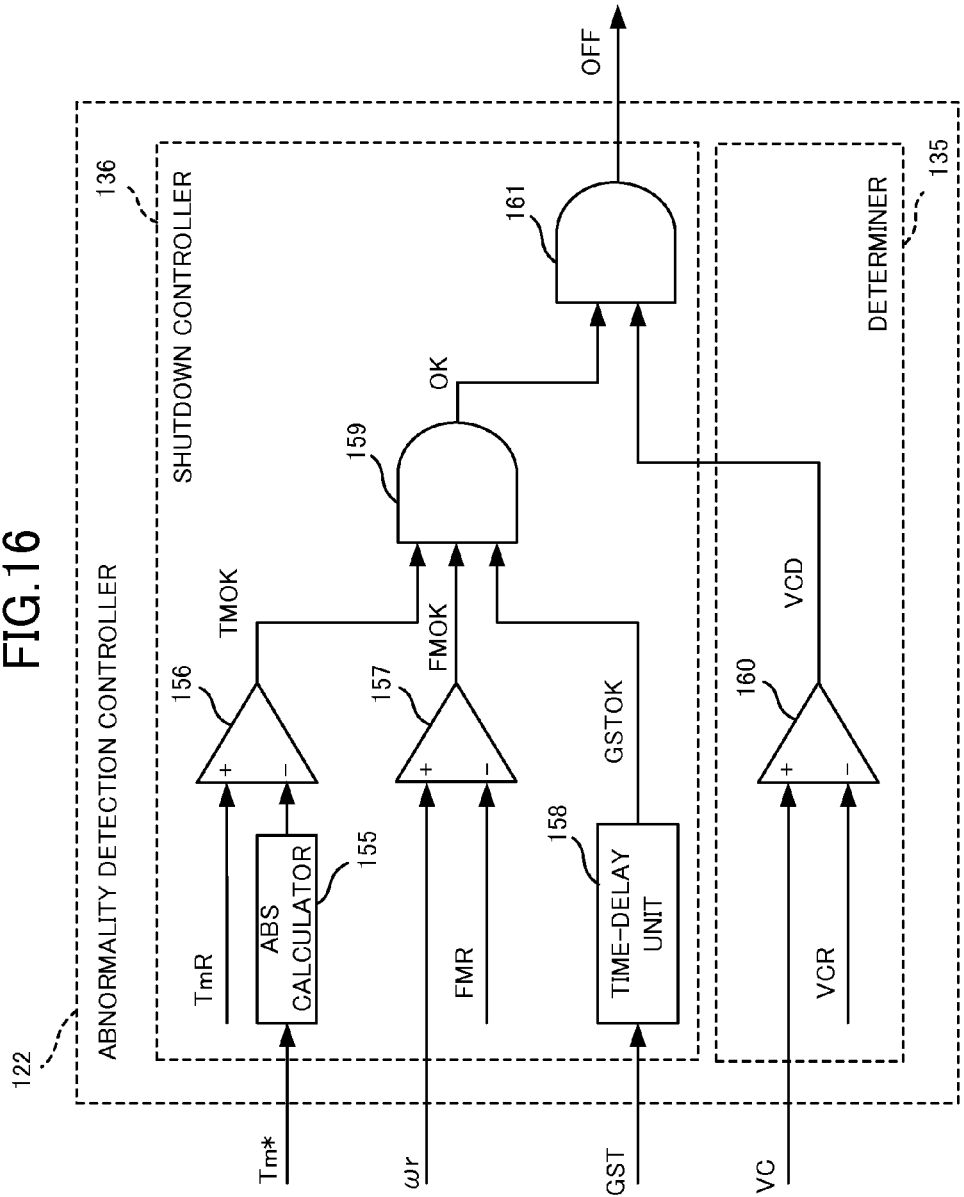
FIG. 16 is a diagram illustrating an example of a logical configuration of an abnormality detection controller according to the embodiment.

FIG. 16 illustrates an example of a logical configuration of the abnormality detection controller 122. The abnormality detection controller 122 includes, an absolute (ABS) calculator 155, a torque of motor (TM) comparator 156, a frequency of motor (FM) comparator 157, a time-delay unit 158, a first conjunction operator 159, a voltage compensation (VC) comparator 160, and a second conjunction operator 161. The VC comparator 160 corresponds to the determiner 135, the ABS calculator 155, the TM comparator 156, the FM comparator 157, the time-delay unit 158, the first conjunction operator 159, and the second conjunction operator 161 correspond to the shutdown controller 136.

The ABS calculator 155 obtains the torque command from the exterior thereof, and outputs a signal indicating the absolute value of the torque command value Tm*.

The TM comparator 156 makes a comparison between the absolute value of the torque command value Tm* indicated by the signal that is output from the ABS calculator 155 and the predetermined threshold value TmR. The TM comparator 156 outputs a TMOK signal in accordance with the result of the comparison. Data indicating the threshold value TmR is set in advance and retained by the abnormality detection controller 122.

More specifically, when the value that is obtained by subtracting the absolute value of the torque command value Tm* from the threshold value TmR is equal to or greater than zero, the TM comparator 156 outputs TMOK signal at high-level (H-level). When a value that is obtained by subtracting the absolute value of the torque command value Tm* from the threshold value TmR is less than zero, the TM comparator 156 outputs an TMOK signal at low-level (L-level). Typically, the signal at H-level is a higher-voltage signal than the signal at L-level, but it is acceptable as long as the signal at H-level and the signal at L-level are distinguishable from each other.

The FM comparator 157 obtains the rotational velocity signal, and makes a comparison between the rotational frequency FM indicated by this rotational velocity signal and the predetermined threshold value FMR. The FM comparator 157 outputs the FMOK signal in accordance with the result of the comparison. Data indicating the threshold value FMR is set in advance and retained by the abnormality detection controller 122.

More specifically, when a value that is obtained by subtracting the threshold value FMR from the rotational frequency FM is greater than zero, the FM comparator 157 outputs the FMOK signal at H-level. When a value that is obtained by subtracting the threshold value FMR from the rotational frequency FM is equal to or less than zero, the FM comparator 157 outputs the FMOK signal at L-level.

The time-delay unit 158 obtains an operation status signal GST from the PWM unit 121 and the like, and outputs a GSTOK signal that is the operation status signal GST delayed by a predetermined certain time T1 [second]. That is, the GSTOK signal indicates whether the time elapsed since the inverter circuit 108 started the operation is equal to or longer than the certain time T1.

More specifically, when the certain time T1 elapses after obtaining the operation status signal GST containing the operation status of the inverter circuit 108, the time-delay unit 158 outputs the H-level GSTOK signal. Thereafter, when obtaining the operation status signal GST indicating the non-operation status, the time-delay unit 158 outputs the GSTOK signal at L-level.

The first conjunction operator 159 obtains the TMOK signal, the FMOK signal, and the GSTOK signal, and outputs an OK signal indicating the conjunction of these signals. More specifically, when the TMOK signal, the FMOK signal, and the GSTOK signal are all at the H-level, the first conjunction operator 159 outputs the OK signal at H-level. In other cases, the first conjunction operator 159 outputs an L-level OK signal. Accordingly, the OK signal is a signal indicating whether or not the valid condition is satisfied.

The VC comparator 160 obtains the voltage compensation quantity signal, and makes a comparison between the voltage compensation quantity VC indicated by this voltage compensation quantity signal and the predetermined threshold value VCR. The VC comparator 160 outputs a VCD signal in accordance with the result of the comparison. Data indicating the threshold value VCR is set in advance and retained by the abnormality detection controller 122.

More specifically, when a value that is obtained by subtracting the threshold value VCR from the voltage compensation quantity VC is greater than zero, the VC comparator 160 outputs a VCD signal at H-level. When a value obtained by subtracting the threshold value VCR from the rotational frequency FM is equal to or smaller than zero, the VC comparator 160 outputs an L-level VCD signal. Accordingly, the VCD signal is a signal indicating whether or not an abnormality is occurring in any one of the electric motors 103a to 103c.

The second conjunction operator 161 obtains the OK signal and the VCD signal, and outputs a signal indicating the conjunction thereof. More specifically, when both OK signal and VCD signal are at H-level, the second conjunction operator 161 outputs the signal at H-level (shutdown signal OFF). In other cases, the first conjunction operator 159 outputs the signal at L-level.

According to the abnormality detection controller 122, the TMOK signal, the FMOK signal, and the GSTOK signal are input to the first conjunction operator 159. Thus, the valid condition includes a case in which the absolute value of the torque command value Tm* being equal to or smaller than the threshold value TmR, the rotational frequency FM being greater than the threshold value FMR, and the time T after the start of the operation of the inverter circuit 108 being equal to or longer than the certain time T1.

The determination result on whether or not an abnormality is occurring in any one of the electric motors 103a to 103c is indicated by the VCD signal from the VC comparator 160.

In addition, when the OK signal at H-level is output from the first conjunction operator 159 due to all valid conditions being satisfied, and the VCD signal is at H-level, the shutdown signal OFF is output from the second conjunction operator 161. Thus, when all valid conditions are satisfied, the VCD signal indicating the determination result by the VC comparator 160 corresponding to the determiner 135 is validated. Hence, it becomes possible to shut down the power supply to each of the electric motors 103a to 103c based on an accurate determination result.

According to this embodiment, the determiner 135 determines whether or not an abnormality is occurring in any of the electric motors 103a to 103c based on the q-axis voltage compensation value 'qe' indicated by the q-axis voltage compensation, and on the d-axis voltage compensation value 'de' indicated by the d-axis voltage compensation. When it is determined that an abnormality is occurring, the shutdown controller 136 shuts down the power supply from the inverter circuit 108 to each of the electric motors 103a to 103c. Hence, it is possible to shut down the operations of the electric motors 103a to 103c when an abnormality occurs in one or more of the electric motors 103a to 103c, thereby preventing the spreading of the damage in one or more of the electric motors 103a to 103c abnormally performing.

The embodiment of the present disclosure was described above, but the present disclosure is not limited to the embodiment, and various modifications made to the embodiment should be included within the scope of the present disclosure.

For example, the electric motors 103a to 103c are not limited to the three-phase AC electric motor, and can be any types of electric motors. The number of electric motors 103a to 103c controlled by the electric motor control device 100 is not limited to three as long as the number is equal to or greater than two.

For example, as is clear from the principle for determining an abnormality in the electric motors 103a to 103c, an abnormality that can be detected by the determiner 135 whether or not such abnormality is occurring is not limited to the freezing of the rotating shaft of the electric motors 103a to 103c. In the case of an abnormality related to a widening difference between the value of current and the current command value of the electric motors 103a to 103c that are comprehensively controlled, the determiner 135 is capable of determining whether or not such abnormality is occurring. For example, the determiner 135 can detect the occurrence of other abnormalities such as an internal short-circuiting of any one of the internal coils 104a, 104b, and 104c in the electric motors 103a to 103c, an abnormality in the wirings of the electric motors 103a to 103c, and the like.

For example, the determiner 135 determines whether or not there is an abnormality in at least one of the electric motors 103a to 103c based on the voltage compensation quantity VC. The voltage compensation quantity VC is an example magnitude of the voltage compensation value, and the magnitude of the voltage compensation value may be, for example, the magnitude of any one of the components contained in the voltage compensation value. The component in the voltage compensation value having a greater magnitude than the other components may be selected as one of the components contained in the voltage compensation value. In this case as well, by the same reasons as those of the case of utilizing the voltage compensation quantity VC, the occurrence of an abnormality in the electric motors 103a to 103c can be determined. By performing a determination based on one of the components in the voltage compensation value, the determination process can be further simplified than the case based on the magnitude of the voltage compensation value.

In addition, the magnitude of the voltage compensation value is an example value obtained from the voltage compensation signal. The value obtained from the voltage compensation signal may be, for example, the voltage compensation value contained in the voltage compensation signal, and a value calculated based on this voltage compensation value.

For example, the voltage command calculator 120 compensates the basic voltage command value by calculating the q-axis voltage compensation value 'qe' and the d-axis voltage compensation value 'de'. However, the voltage command calculator 120 may compensate, for example, only the q-axis basic voltage command value EQ or the d-axis basic voltage command value ED. That is, the voltage command calculator 120 may only compensate the q-axis basic voltage command value EQ by calculating only the q-axis voltage compensation value 'qe', or may compensate the d-axis basic voltage command value ED by calculating only the d-axis voltage compensation value 'de'. Although the compensation of both of the q-axis component and the d-axis component in the basic voltage command value brings about excellent control characteristics, the process can be further simplified by having only the q-axis component or the d-axis component of the basic voltage command value compensated, which can simplify the configuration of the voltage command calculator 120.

INDUSTRIAL APPLICABILITY

The present disclosure can be applied to, for example, the electric motor control device and the electric motor control method to control the electric motors mounted on an arbitrary industrial machine.

REFERENCE SIGNS LIST

100 Electric motor control device
103a, 103b, 103c Electric motor
108 Inverter circuit
109 Switch 110a, 110b, 110c Current detector
111 Rotational velocity detector
112 Controller
117 Current command generator
118 Phase angle calculator
119 Coordinate converter
120 Voltage command calculator
121 PWM unit
122 Abnormality detection controller
125 q-axis subtractor
126 q-axis compensation calculator
127 d-axis subtractor
128 d-axis compensation calculator
129 Basic voltage command calculator
130 q-axis adder
131 d-axis adder
132 Output voltage command calculator
133 Voltage compensation quantity calculator
135 Determiner
136 Shutdown controller
155 ABS calculator
156 TM comparator
157 FM comparator
158 Time-delay unit
159 First conjunction operator
160 VC comparator
161 Second conjunction operator

The invention claimed is:

1. An electric motor control device comprising:
an inverter circuit that supplies power to a plurality of electric motors connected in parallel with the inverter circuit; and
a controller that controls the power supplied from the inverter circuit to each of the plurality of electric motors, wherein:
the controller includes:
a current command generator that generates a current command indicating a value of current supplied from the inverter circuit to the plurality of electric motors;
a compensation calculator that outputs a voltage compensation signal for compensating a difference between a value of actual current supplied to each of the plurality of electric motors and a value of current indicated by the current command;
a determiner that determines, based on a value obtained from the voltage compensation signal, whether or not an abnormality is occurring in at least one of the plurality of electric motors; and
a shutdown controller that shuts down the power supply from the inverter circuit to each of the plurality of electric motors when a valid condition for improving accuracy of determination by the determiner is satisfied and the determiner determines that an abnormality is occurring; and
the valid condition includes a rotational frequency of at least one of the plurality of electric motors being equal to or greater than a threshold value.

2. The electric motor control device according to claim 1, further comprising a current detector that detects the value of actual current supplied to the plurality of electric motors, and outputs a current value signal indicating the detected value of current,
wherein the compensation calculator calculates, by referring to the current value signal output from the current detector, a value of voltage for compensating the difference, and generates the voltage compensation signal containing the value of voltage.

3. The electric motor control device according to claim 1, wherein the determiner determines, based on a comparison result between a magnitude of the value of voltage indicated by the voltage compensation signal and a threshold value, whether or not an abnormality is occurring in at least one of the plurality of electric motors.

4. The electric motor control device according to claim 2, wherein the determiner determines, based on a comparison result between a magnitude of the value of voltage indicated by the voltage compensation signal and a threshold value, whether or not an abnormality is occurring in at least one of the plurality of electric motors.

5. The electric motor control device according to claim 3, wherein the magnitude of the value of voltage is the maximum value of magnitudes of a plurality of components contained in the value of voltage.

6. The electric motor control device according to claim 4, wherein the magnitude of the value of voltage is the maximum value of magnitudes of a plurality of components contained in the value of voltage.

7. The electric motor control device according to claim 1, wherein the valid condition includes a torque to be output from at least one of the plurality of electric motors, or a value or an index that is associated with the torque being equal to or less than a threshold value.

8. The electric motor control device according to claim 1, wherein the valid condition includes the value of current indicated by the current command, or the value of current supplied to any one or more of the plurality of electric motors being equal to or less than a threshold value.

9. The electric motor control device according to claim 1, wherein the valid condition includes an elapsed time after the inverter circuit starts an operation being longer than a threshold value.

10. An electric motor control method comprising:
generating a current command that indicates a value of current output from an inverter circuit to a plurality of electric motors, the inverter circuit supplying power to the plurality of electric motors connected in parallel with the inverter circuit;
generating a voltage compensation signal for compensating a difference between a value of actual current supplied to each of the plurality of electric motors and a value of current indicated by the current command;
determining, based on a value obtained from the voltage compensation signal, whether or not an abnormality is occurring in at least one of the plurality of electric motors; and
shutting down the power supply from the inverter circuit to each of the plurality of electric motors when a valid condition for improving accuracy of determination is satisfied upon determining that an abnormality is occurring,
wherein the valid condition includes a rotational frequency of at least one of the plurality of electric motors being equal to or greater than a threshold value.

* * * * *